(12) United States Patent
Jang et al.

(10) Patent No.: US 11,688,440 B2
(45) Date of Patent: Jun. 27, 2023

(54) PAGE BUFFER AND SEMICONDUCTOR MEMORY DEVICE HAVING THE SAME

(71) Applicant: SK hynix Inc., Icheon-si Gyeonggi-do (KR)

(72) Inventors: Jung Shik Jang, Icheon-si Gyeonggi-do (KR); Hoon Choi, Icheon-si Gyeonggi-do (KR); Dong Hun Lee, Icheon-si Gyeonggi-do (KR); Yun Sik Choi, Icheon-si Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 50 days.

(21) Appl. No.: 17/220,320

(22) Filed: Apr. 1, 2021

(65) Prior Publication Data
US 2022/0108734 A1    Apr. 7, 2022

(30) Foreign Application Priority Data
Oct. 5, 2020    (KR) .................. 10-2020-0128216

(51) Int. Cl.
*G11C 7/12*    (2006.01)
*G11C 7/10*    (2006.01)

(52) U.S. Cl.
CPC .............. *G11C 7/12* (2013.01); *G11C 7/106* (2013.01); *G11C 7/1048* (2013.01); *G11C 7/1057* (2013.01); *G11C 7/1084* (2013.01); *G11C 7/1087* (2013.01)

(58) Field of Classification Search
CPC ........ G11C 7/12; G11C 7/1048; G11C 7/1057; G11C 7/106; G11C 7/1084; G11C 7/1087
See application file for complete search history.

(56) References Cited

U.S. PATENT DOCUMENTS

| 2012/0002486 A1* | 1/2012 | Kim ...................... G11C 16/20 365/233.1 |
| 2018/0366201 A1* | 12/2018 | Murakami ........... G11C 29/026 |
| 2019/0287629 A1* | 9/2019 | Bang ....................... G11C 27/00 |

FOREIGN PATENT DOCUMENTS

| KR | 100865820 B1 | 10/2008 |
| KR | 101809202 B1 | 12/2017 |

* cited by examiner

*Primary Examiner* — Tri M Hoang
(74) *Attorney, Agent, or Firm* — William Park & Associates Ltd.

(57) ABSTRACT

The present technology relates to a page buffer and a semiconductor memory device including the same. The page buffer includes a bit line selector configured to connect a bit line of a memory cell array to a sensing node, a precharger configured to precharge a potential of the sensing node to a first level, and a latch component configured to sense data by detecting a time at which the potential of the sensing node is decreased from the first level to a second level.

11 Claims, 12 Drawing Sheets

FIG. 12
| | Q<1> | Q<2> | Q<3> | DATA | |
|---|---|---|---|---|---|
| | | | | MSB | LSB |
| E | 1 | 1 | 1 | 1 | 1 |
| PV1 | 0 | 1 | 1 | 0 | 1 |
| PV2 | 0 | 0 | 1 | 0 | 0 |
| PV3 | 0 | 0 | 0 | 1 | 0 |
FIG. 13
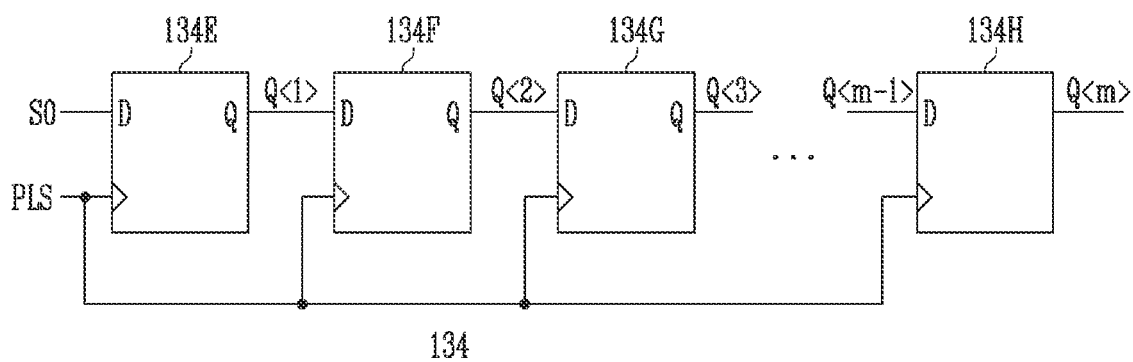
FIG. 14
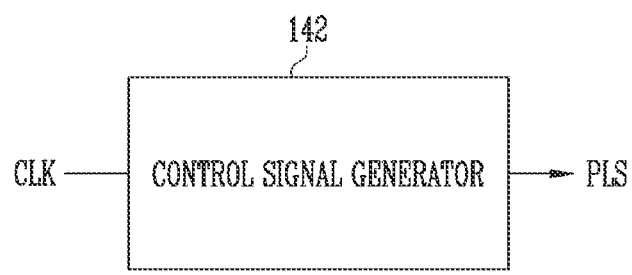

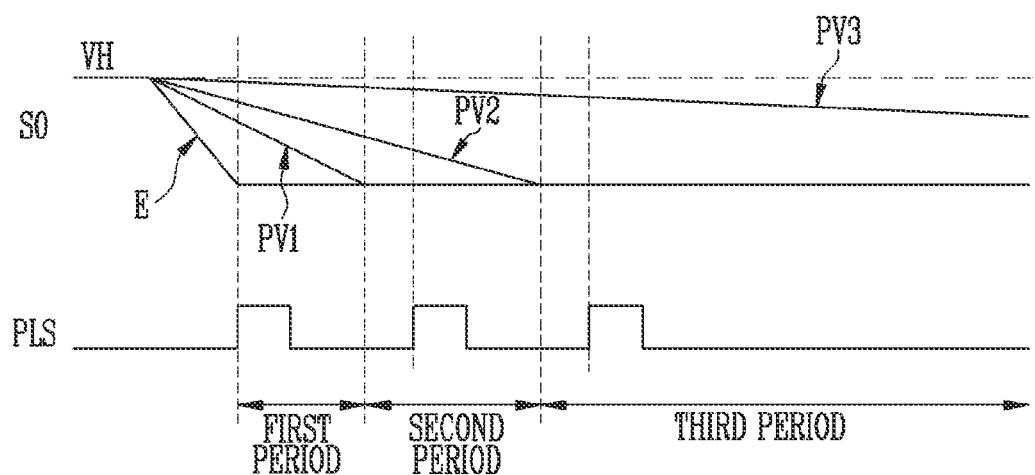

PAGE BUFFER AND SEMICONDUCTOR MEMORY DEVICE HAVING THE SAME

CROSS-REFERENCE TO RELATED APPLICATION

The present application claims priority under 35 U.S.C. § 119(a) to Korean patent application number 10-2020-0128216 filed on Oct. 5, 2020, in the Korean Intellectual Property Office, the entire disclosure of which is incorporated by reference herein.

BACKGROUND

1. Technical Field

The present disclosure relates to an electronic device, and more particularly, to a page buffer and a semiconductor memory device including the same.

2. Related Art

A semiconductor memory device is a memory device that is implemented using a semiconductor such as silicon (Si), germanium (Ge), gallium arsenide (GaAs), or indium phosphide (InP). The semiconductor memory device is largely classified into a volatile memory device and a nonvolatile memory device.

The volatile memory device is a memory device in which stored data is lost when power supply is cut off. The volatile memory device includes a static RAM (SRAM), a dynamic RAM (DRAM), a synchronous DRAM (SDRAM), and the like. The nonvolatile memory device is a memory device that maintains stored data even though power supply is cut off. The nonvolatile memory device includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is largely divided into a NOR type and a NAND type.

SUMMARY

A page buffer according to an embodiment of the present disclosure includes a bit line selector configured to connect a bit line of a memory cell array to a sensing node, a precharger configured to precharge a potential of the sensing node to a first level, and a latch component configured to sense data by detecting a time at which the potential of the sensing node is decreased from the first level to a second level.

A semiconductor memory device according to an embodiment of the present disclosure includes a memory block with a plurality of memory cells that are programmed to an erase state and a plurality of program states, a voltage generation circuit configured to generate one read voltage to be applied to word lines of the memory block during a read operation, and a read and write circuit that is connected to bit lines of the memory block and configured to latch data by sensing a potential level of a sensing node based on a cell current of the memory cells during the read operation.

A semiconductor memory device according to an embodiment of the present disclosure includes a memory block with a plurality of memory cells that are programmed to an erase state and a plurality of program states, a voltage generation circuit configured to generate one read voltage to be applied to word lines of the memory block during a read operation, and a page buffer connected to a bit line of the memory block, configured to precharge a potential of a sensing node that is connected to the bit line to a first level during the read operation, and latch data by detecting a time at which the sensing node is decreased from the first level to a second level based on a program state of a selected memory cell among the plurality of memory cells that are connected to the bit line.

BRIEF DESCRIPTION OF THE DRAWINGS

FIG. 12 is a diagram illustrating a data value output from the latch component shown in FIG. 9.

FIG. 13 is a diagram illustrating a second embodiment of the latch component of FIG. 6.

FIG. 14 is a diagram illustrating a second embodiment of the control signal generator.

FIG. 15 is a waveform diagram of signals illustrating an operation of a latch component shown in FIG. 13.

FIG. 16 is a diagram illustrating a data value output from the latch component shown in FIG. 13.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, an embodiment of the present disclosure will be described in detail with reference to the accompanying drawings, so that those skilled in the art to which the present disclosure pertains may easily carry out the technical spirit of the present disclosure.

An embodiment of the present disclosure provides a page buffer capable of performing a read operation on a plurality of program states in a state in which one read voltage is applied to a word line during a read operation, and a semiconductor memory device including the page buffer.

According to the present technology, a read operation on a plurality of program states may be performed in a state in which one read voltage is applied to a word line during a read operation, thereby reducing a read operation time.

Figure 1:
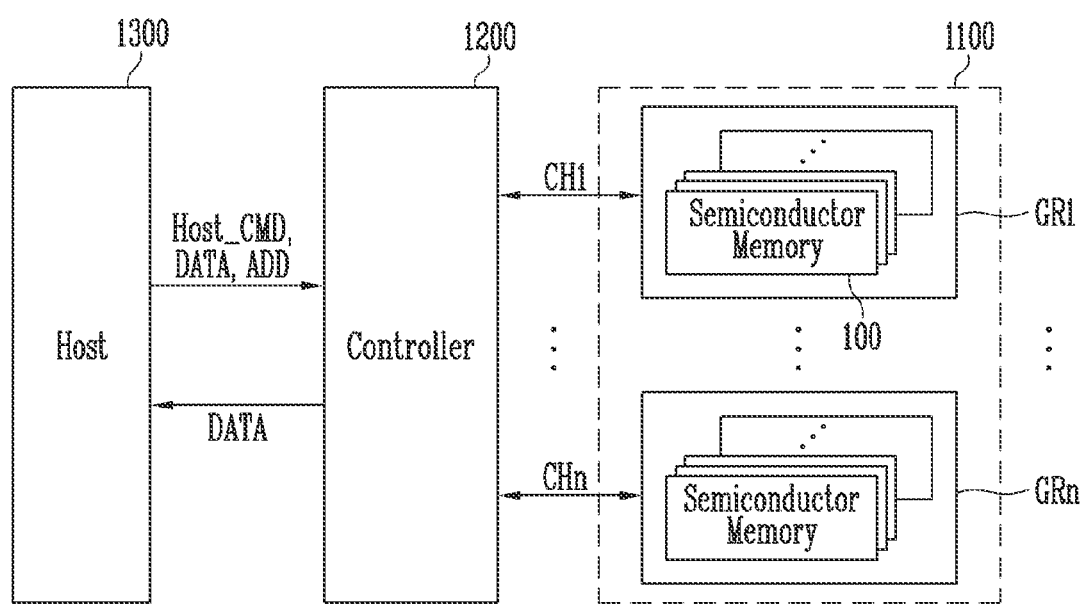
FIG. 1 is a block diagram illustrating a memory system including a memory device according to an embodiment of the present disclosure.

FIG. 1 is a block diagram illustrating a memory system including a memory device according to an embodiment of the present disclosure.

Referring to FIG. 1, the memory system 1000 may include a memory device 1100, a controller 1200, and a host 1300. The memory device 1100 may include a plurality of semiconductor memory devices 100. The plurality of semiconductor memory devices 100 may be divided into a plurality of groups. Although the host 1300 is shown and described as being included in the memory system 1000 in the embodiment of the present disclosure, the memory system 1000 may be configured to include only the controller 1200 and the memory device 1100, and the host may be configured to be disposed outside of the memory system 1000.

In FIG. 1, the plurality of groups GR1 to GRn of the memory device 1100 communicate with the controller 1200 through first to n-th channels CH1 to CHn, respectively. Each semiconductor memory device 100 is described later with reference to FIG. 2.

Each of the groups GR1 to GRn may be configured to communicate with the controller 1200 through one common channel. The controller 1200 may be configured to control the plurality of semiconductor memories 100 of the memory device 1100 through the plurality of channels CH1 to CHn.

The controller 1200 may be connected between the host 1300 and the memory device 1100. The controller 1200 may be configured to access the memory device 1100 in response to a request from the host 1300. For example, the controller 1200 may be configured to control the read, program, erase, and background operations of the memory device 1100 in response to a host command Host_CMD that is received from the host 1300. During the program operation, the host 1300 may transmit an address ADD and data DATA to be programmed together with the host command Host_CMD, and during the read operation, the host 1300 may transmit the address ADD together with the host command Host_CMD. During the program operation, the controller 1200 may transmit a command corresponding to the program operation and the data DATA to be programmed to the memory device 1100. During the read operation, the controller 1200 may transmit a command corresponding to the read operation to the memory device 1100, may receive the read data DATA from the memory device 1100, and may transmit the received data DATA to the host 1300. The controller 1200 may be configured to provide an interface between the memory device 1100 and the host 1300. The controller 1200 may be configured to drive firmware for controlling the memory device 1100.

The host 1300 may include a portable electronic device such as a computer, a PDA, a PMP, an MP3 player, a camera, a camcorder, or a mobile phone. The host 1300 may request a program operation, a read operation, an erase operation, or the like of the memory system 1000 through the host command Host_CMD. The host 1300 may transmit the host command Host_CMD, the data DATA, and the address ADD corresponding to the program operation to the controller 1200 for the program operation of the memory device 1100 and may transmit the host command Host_CMD and the address ADD corresponding to the read operation for the read operation to the controller 1200. At this time, the address ADD may be a logical address (logical address block) of data.

The controller 1200 and the memory device 1100 may be integrated into one semiconductor memory device. As an exemplary embodiment, the controller 1200 and the memory device 1100 may be integrated into a one semiconductor memory device to configure a memory card. For example, the controller 1200 and the memory device 1100 may be integrated into a one semiconductor memory device to configure a memory card such as a PC card (personal computer memory card international association (PCM-CIA)), a compact flash card (CF), a smart media card (SM or SMC), a memory stick, a multimedia card (MMC, RS-MMC, or MMCmicro), an SD card (SD, miniSD, microSD, or SDHC), and a universal flash stage device (UFS).

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an exemplary embodiment, the memory device 1100 or memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 2:
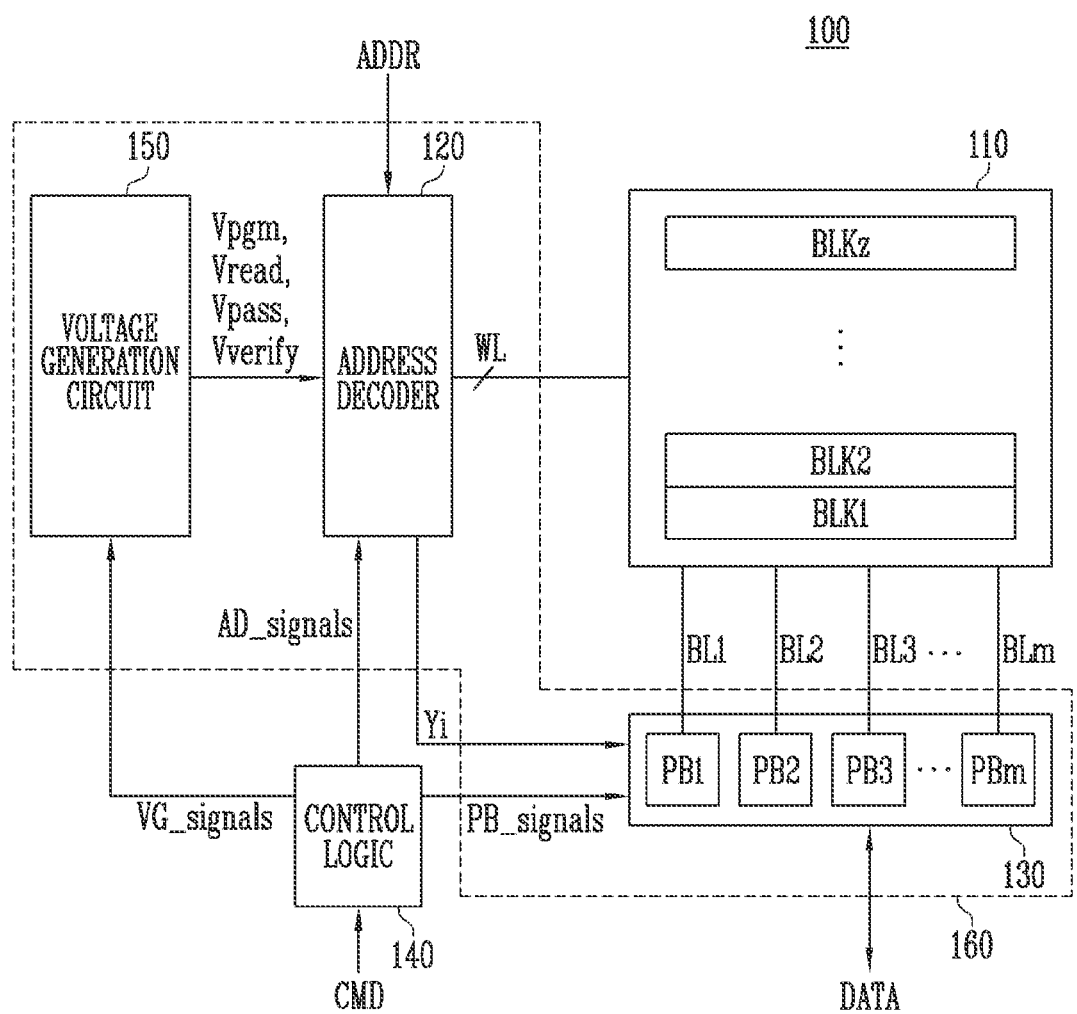
FIG. 2 is a diagram illustrating a semiconductor memory device included in the memory device of FIG. 1.

FIG. 2 is a diagram illustrating the semiconductor memory device included in the memory device of FIG. 1.

Referring to FIG. 2, the semiconductor memory device 100 may include a memory cell array 110, an address decoder 120, a read and write circuit 130, a control logic 140, and a voltage generation circuit 150. The address decoder 120, the read and write circuit 130, and the voltage generation circuit 150 may be defined as a peripheral circuit 160 that performs a read operation on the memory cell array 110.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read and write circuit 130 through bit lines BL1 to BLm. Each of the plurality of memory blocks BLK1 to BLKz may include a plurality of memory cells. As an embodiment, the plurality of memory cells are nonvolatile memory cells. A plurality of memory cells among the plurality of memory cells that are connected to one word line may be defined as one page. That is, the memory cell array 110 may be configured of a plurality of pages.

Each of the plurality of memory blocks BLK1 to BLKz of the memory cell array 110 may include a plurality of memory strings. Each of the plurality of memory strings may include a drain select transistor, a plurality of memory cells, and a source select transistor that are connected in series between a bit line and a source line. In addition, each of the plurality of memory strings may include a pass transistor between the source select transistor and the memory cells, between the drain select transistor and the memory cells, and may further include a pipe gate transistor between the memory cells. A detailed description of the memory cell array 110 is described later.

Each of the plurality of memory cells may store a plurality of data bits such as a multi-level cell (MLC), a triple level cell (TLC), or a quadruple level cell (QLC).

The address decoder 120 is connected to the memory cell array 110 through the word lines WL. The address decoder 120 may be configured to operate in response to address decoder control signals AD_signals that are generated in the control logic 140. The address decoder 120 may receive an address ADDR through an input/output buffer (not shown) that is inside the memory device 100.

The address decoder 120 may decode a row address of the received address ADDR and may apply a plurality of operation voltages, including a program voltage Vpgm, a read voltage Vread, a pass voltage Vpass, and a verify voltage Vverify generated by the voltage generation circuit 150 to the plurality of memory cells of the memory cell array 110 based on the decoded row address.

The address decoder 120 may be configured to decode a column address of the received address ADDR. The address decoder 120 may transmit a decoded column address Yi to the read and write circuit 130.

The address ADDR that is received during the program operation or the read operation may include a block address, the row address, and the column address. The address decoder 120 may select one memory block and one word line based on the block address and the row address. The column address may be decoded by the address decoder 120 and may be provided to the read and write circuit 130.

The address decoder 120 may include a block decoder, a row decoder, a column decoder, an address buffer, and the like.

The read and write circuit 130 may include a plurality of page buffers PB1 to PBm. The plurality of page buffers PB1 to PBm may be connected to the memory cell array 110 through the bit lines BL1 to BLm. During the read operation or the verify operation, the plurality of page buffers PB1 to PBm may perform a data sensing operation that senses the program state of the memory cells that are connected to the bit lines BL1 to BLm. During the data sensing operation, each of the plurality of page buffers PB1 to PBm may latch data based on the cell current of a selected memory cell that is connected to a corresponding bit line. For example, each of the plurality of page buffers PB1 to PBm may check a time at which a sensing node that is precharged to a first level is decreased to a second level based on the cell current of the selected memory cell that is connected to the corresponding bit line and may latch a data value corresponding to the checked time. For example, each of the plurality of page buffers PB1 to PBm may latch data corresponding to a potential level of the sensing node at each of a plurality of set time points. At this time, one read voltage may be applied to a word line that is connected to the selected memory cell.

The read and write circuit 130 may operate in response to page buffer control signals PB_signals that are output from the control logic 140.

As an exemplary embodiment, the read and write circuit 130 may include the page buffers (or page registers), a column select circuit, and the like.

The control logic 140 may be connected to the address decoder 120, the read and write circuit 130, and the voltage generation circuit 150. The control logic 140 may receive a command CMD through the input/output buffer (not shown) of the semiconductor memory device 100. The control logic 140 may be configured to control an overall operation of the semiconductor memory device 100 in response to the command CMD. For example, the control logic 140 may receive the command CMD corresponding to the program operation and may generate and output the address decoder control signals AD_signals that control the address decoder 120, the page buffer control signals PB_signals that control the read and write circuit 130, and voltage generation circuit control signals VG_signals that control the voltage generation circuit 150 in response to the received command CMD. In addition, the control logic 140 may receive the command CMD corresponding to the read operation and may generate and output the address decoder control signals AD_signals that control the address decoder 120, the page buffer control signals PB_signals that control the read and write circuit 130, and the voltage generation circuit control signals VG_signals that control the voltage generation circuit 150 in response to the received command CMD.

During the program operation, the voltage generation circuit 150 may generate the program voltage Vpgm, the pass voltage Vpass, and the verify voltage Vverify based on the voltage generation circuit control signals VG_signals that are output from the control logic 140 and may output the program voltage Vpgm, the pass voltage Vpass, and the verify voltage Vverify to the address decoder 120. In addition, during the read operation, the voltage generation circuit 150 may generate the read voltage Vread and the pass voltage Vpass based on the voltage generation circuit control signals VG_signals that are output from the control logic 140 and may output one read voltage Vread and the pass voltage Vpass to the address decoder 120.

The voltage generation circuit 150, according to an embodiment of the present disclosure, may output one read voltage during a read operation on memory cells in which a plurality of data bits are stored.

Figure 3:
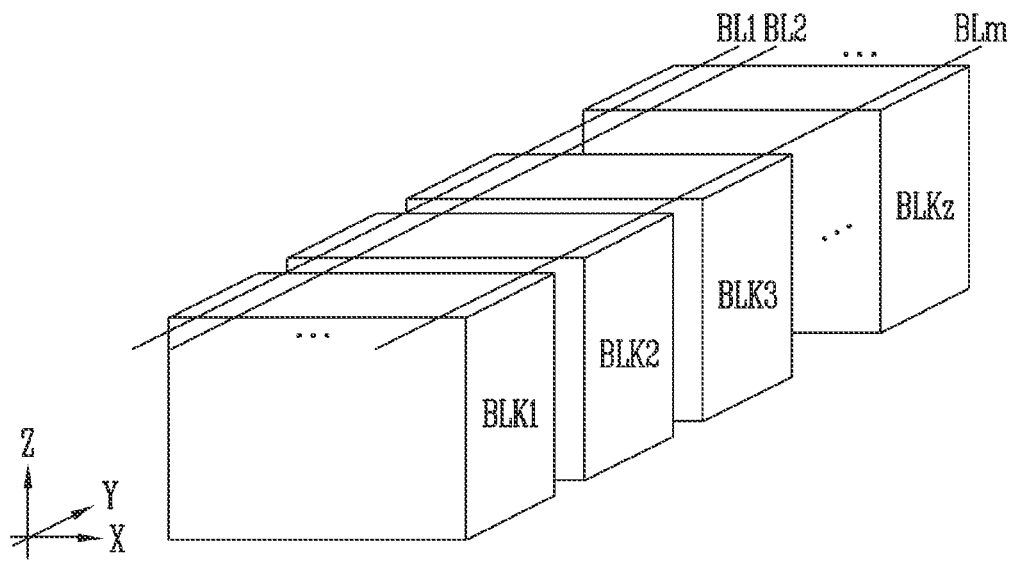
FIG. 3 is a diagram illustrating three-dimensional memory blocks.

FIG. 3 is a diagram illustrating three-dimensional memory blocks.

Referring to FIG. 3, the three-dimensional memory blocks BLK1 to BLKz may be arranged to be spaced apart from each other along a direction Y in which the bit lines BL1 to BLm extend. For example, first to z-th memory blocks BLK1 to BLKz may be arranged to be spaced apart from each other along a second direction Y, and include a plurality of memory cells stacked along a third direction Z. The configuration of any one of the first to z-th memory blocks BLK1 to BLKz is specifically described later with reference to FIGS. 4 and 5.

Figure 4:
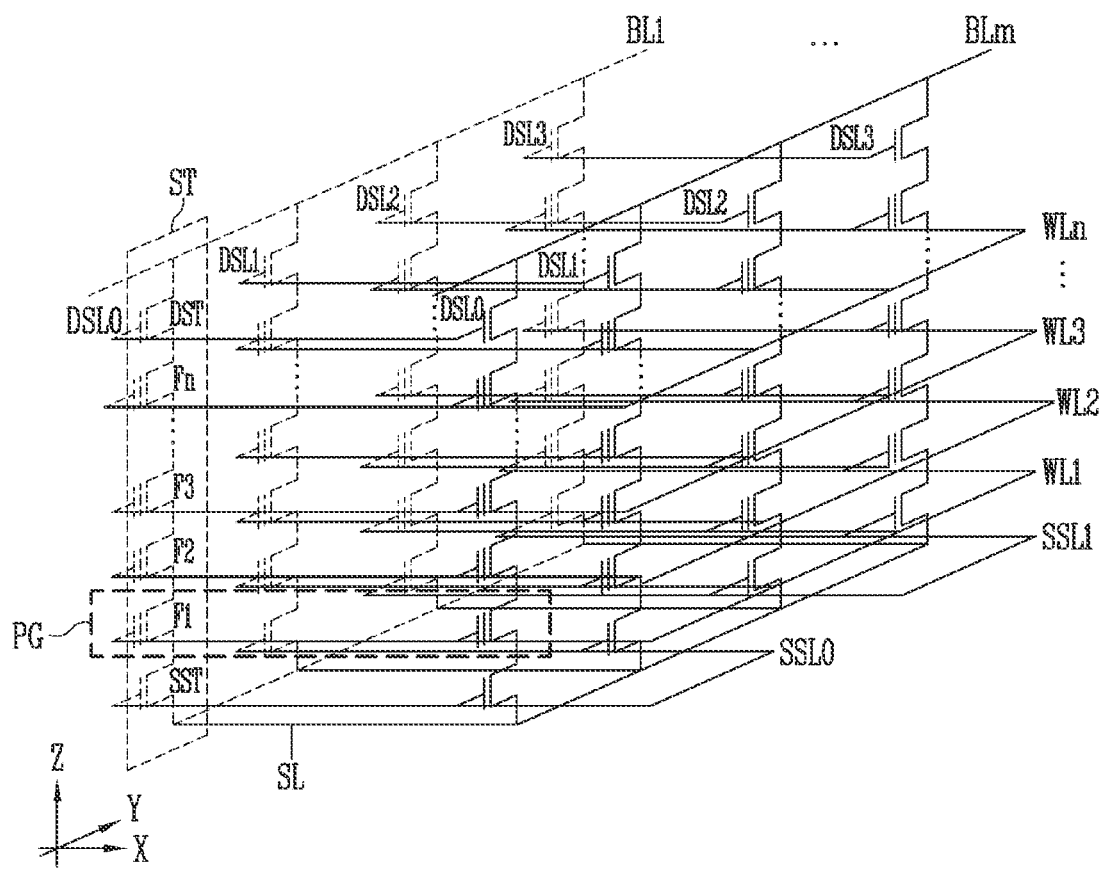
FIG. 4 is a circuit diagram specifically illustrating any one of memory blocks shown in FIG. 3.

FIG. 4 is a circuit diagram specifically illustrating any one of the memory blocks shown in FIG. 3.

Figure 5:
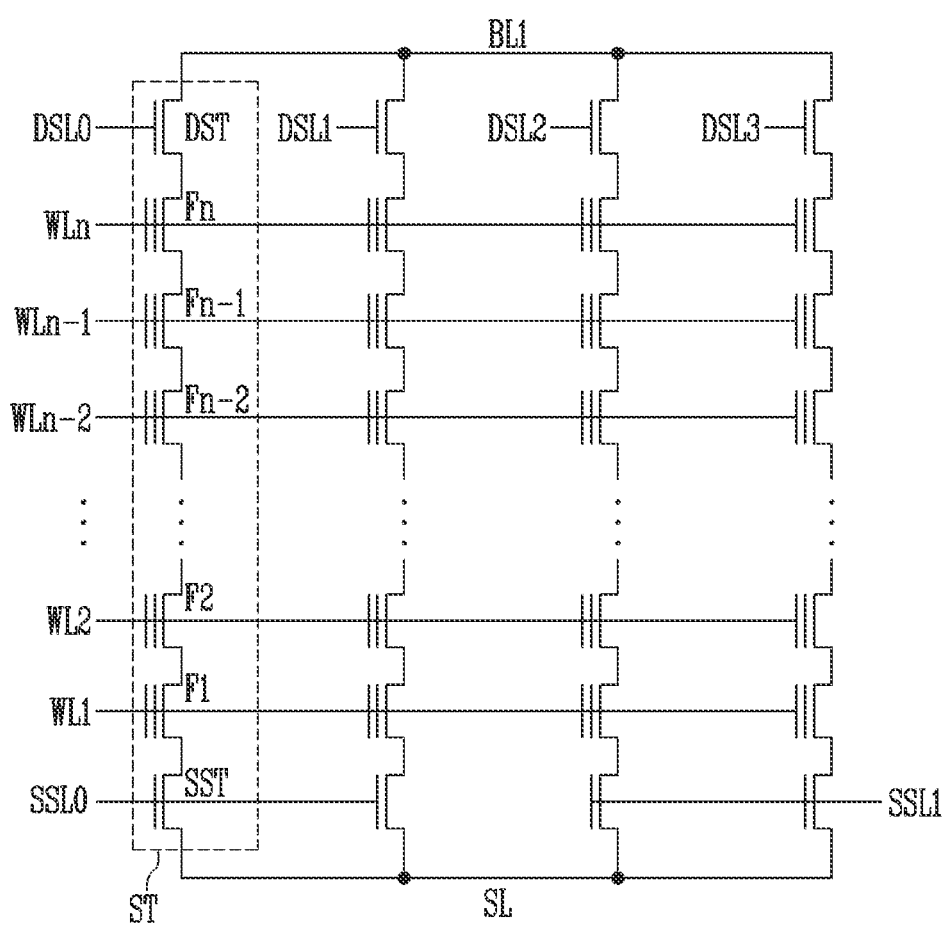
FIG. 5 is a circuit diagram illustrating memory strings shown in FIG. 4.

FIG. 5 is a circuit diagram illustrating memory strings shown in FIG. 4.

Referring to FIGS. 4 and 5, each memory string ST may be connected between the bit lines BL1 to BLm and a source line SL. The memory string ST that is connected between the first bit line BL1 and the source line SL is described as an example.

The memory string ST may include source select transistors SST, memory cells F1 to Fn (n is a positive integer), and a drain select transistor DST that are connected in series between the source line SL and the first bit line BL1. Gates of the source select transistors SST that are included in different memory strings ST, connected to different bit lines BL1 to BLm, may be connected to a first source select line SSL0 and a second source select line SSL1. For example, source select transistors among the source select transistors SST that are adjacent to each other in the second direction Y, may be connected to the same source select line. For example, assuming that the source select transistors SST are sequentially arranged along the second direction Y, the gates of the source select transistors SST that are arranged in the first direction X from a first source select transistor SST and included in different strings ST and the gates of the source select transistors SST that are arranged in the first direction X from a second source select transistor SST and included in different strings ST may be connected to the first source select line SSL0. In addition, the gates of the source select transistors SST arranged in the first direction X from a third source select transistor SST and included in different strings ST and the gates of the source select transistors SST arranged in the first direction X from a fourth source select transistor SST and included in different strings ST may be connected to the second source select line SSL1.

Gates of the memory cells F1 to Fn may be connected to the word lines WL1 to WLn, and gates of the drain select transistors DST may be connected to any one of first to fourth drain select lines DSL0 to DSL3.

Gates of transistors among the drain select transistors DST that are arranged in the first direction X, may be commonly connected to the same drain select line (for example, DSL0), but transistors arranged in the second direction Y may be connected to different drain select lines DSL1 to DSL3. For example, assuming that the drain select transistors DST are sequentially arranged along the second direction Y, the gates of the drain select transistors DST arranged in the first direction X from a first drain select transistor DST and included in different strings ST may be connected to a first drain select line DSL0. The drain select transistors DST that are arranged in the second direction Y from the drain select transistors DST that are connected to the first drain select line DSL0 may be sequentially connected to second to fourth drain select lines DSL1 to DSL3. Therefore, the memory strings ST that are connected to a selected drain select line may be selected within a selected memory block, and memory strings ST that are connected to remaining unselected drain select lines may be unselected.

Memory cells that are connected to the same word line may form one page PG. Here, page means a physical page. For example, among the strings ST that are connected to the first bit line BL1 to the m-th bit line BLm, a group of memory cells that are connected in the first direction X at the same word line is referred to as the page PG. For example, among the first memory cells F1 that are connected to the first word line WL1, memory cells arranged along the first direction X may form one page PG. Cells among the first memory cells F1 that are arranged in the second direction Y, commonly connected to the first word line WL1, may be divided into different pages. Therefore, when the first drain select line DSL0 is the selected drain select line and the first word line WL1 is the selected word line, the page that is connected to the first drain select line DSL0 may become a selected page among a plurality of pages PG that are connected to the first word line WL1. The pages that are commonly connected to the first word line WL1, but connected to the unselected second to fourth drain select lines DSL1 to DSL3, may become unselected pages.

In the drawing, one source select transistor SST and one drain select transistor DST are included in one string ST, but a plurality of source select transistors SST and a plurality of drain select transistors DST may be included in one string ST according to the semiconductor memory device. In addition, dummy cells may be included between the source select transistor SST, the memory cells F1 to Fn, and the drain select transistor DST according to the memory device. The dummy cells might not store user data like normal memory cells F1 to Fn, but may be used to improve an electrical characteristic of each string ST. However, the dummy cells are not an important configuration in the present embodiment, and thus, a detailed description thereof is omitted.

Figure 6:
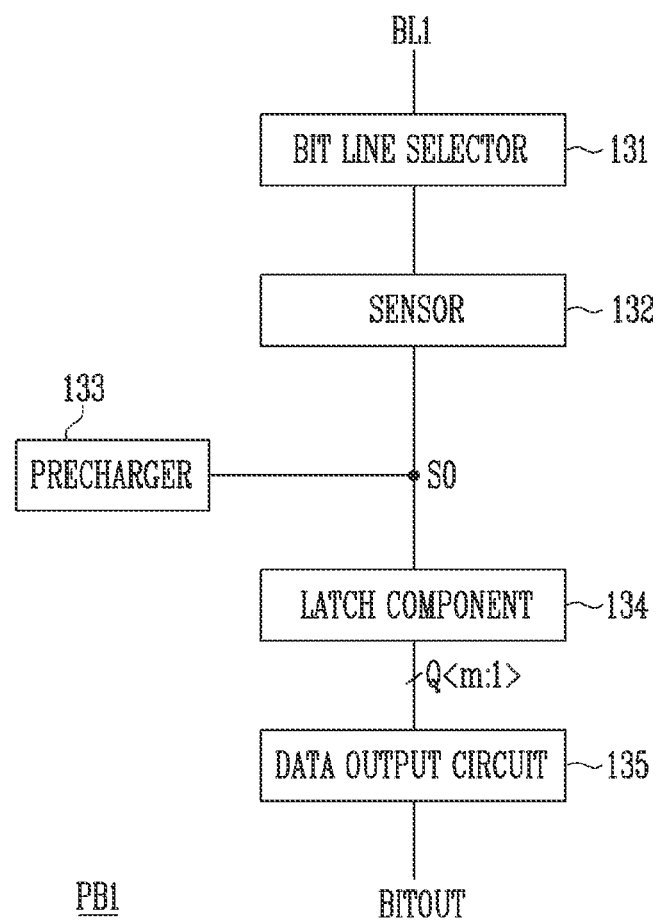
FIG. 6 is a diagram illustrating a page buffer of FIG. 2.

FIG. 6 is a diagram illustrating the page buffer of FIG. 2.

The plurality of page buffers PB1 to PBm shown in FIG. 2 may be configured similarly to each other, and the page buffer PB1 is described with reference to FIG. 6 for convenience of description.

Referring to FIG. 6, the page buffer PB1 may include a bit line selector 131, a sensor 132, a precharger 133, a latch component 134, and a data output circuit 135.

The bit line selector 131 may be connected between the corresponding bit line BL1 and the sensor 132 and may electrically connect the corresponding bit line BL1 and the sensor 132 during the read operation.

The sensor 132 may be connected between the bit line selector 131 and a sensing node SO. The sensor 132 may connect the sensing node SO to the bit line BL1 that is connected through the bit line selector 131 during the read operation and may evaluate the sensing node SO based on the current amount of the bit line BL1. For example, the sensor 132 may decrease the potential of the sensing node SO that is precharged to the first level to the second level based on the current amount of the bit line BL1, and as the current amount of the bit line BL1 increases, the time at which the potential is decreased to the second level may decrease. That is, during the read operation, the sensing node SO may be decreased from the first level to the second level based on the cell current of the selected memory cell that is connected to the bit line BL1. In addition, as an amount of the cell current of the selected memory cell increases, the time at which the potential of the sensing node SO is decreased from the first level to the second level may decrease, and as the amount of cell current decreases, the time at which the potential of the sensing node SO is decreased from the first level to the second level may increase.

The precharger 133 may be connected to the sensing node SO, may precharge the bit line BL1 to a setting level through the sensor 132 and the bit line selector 131, and may precharge the sensing node SO to the first level during the read operation.

The latch component 134 may be connected to the sensing node SO and may latch data by sensing the potential level of the sensing node SO every predetermined time.

The data output circuit 135 may be connected between output terminals Q<m;1> of the latch component 134 and a bit out line BITOUT, which is an output terminal of the page buffer PB1. The data output circuit 135 may receive the data that is latched in the latch component 134 and may output the data to the bit out line BITOUT.

Figure 7:
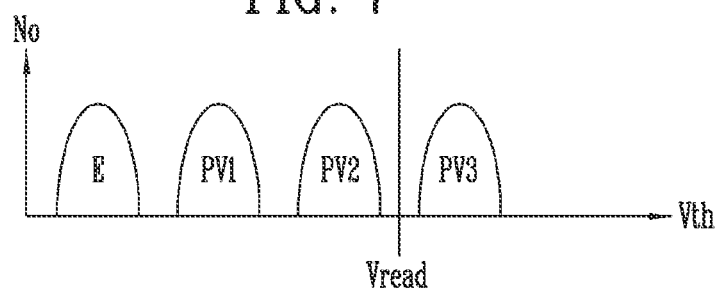
FIG. 7 is a threshold voltage distribution diagram illustrating an erase state, a plurality of program states, and a read voltage.

FIG. 7 is a threshold voltage distribution diagram illustrating an erase state, a plurality of program states, and a read voltage.

Figure 8:
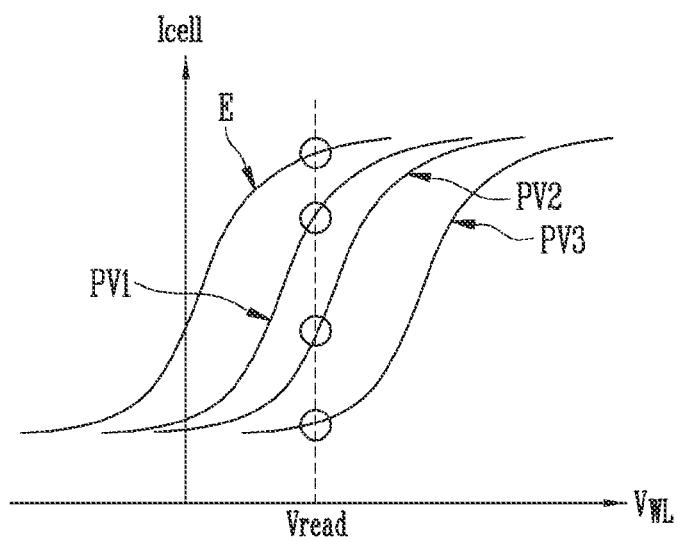
FIG. 8 is a graph illustrating a cell current of an erase state and a plurality of program states.

FIG. 8 is a graph illustrating a cell current of an erase state and a plurality of program states.

In an embodiment of the present disclosure, a case in which the plurality of memory cells F1 to Fn, shown in FIG. 5, are the MLC is described as an example.

Referring to FIGS. 7 and 8, the plurality of memory cells F1 to Fn, shown in FIG. 5, may be programmed in an erase state E and a plurality of program states PV1 to PV3. The erase state E and the plurality of program states PV1 to PV3 may have different threshold voltage distributions. As shown in FIG. 7, the threshold voltage distribution of the program state PV1 may be higher than a threshold voltage of the erase state E, and the threshold voltage distribution of the program state PV2 may be higher than a threshold voltage of the program state PV1. In addition, the threshold voltage distribution of the program state PV3 may be higher than a threshold voltage of the program state PV2.

When the read voltage Vread is applied to the word lines of the plurality of memory cells F1 to Fn during the read operation, memory cells corresponding to the erase state E and the program states PV1 and PV2 may be turned on, and memory cells corresponding to the program state PV3 may be turned off. At this time, as shown in FIG. 8, when the read voltage Vread is applied to the word line, the cell current amount of the plurality of memory cells F1 to Fn may be changed based on the corresponding erase state E and plurality of program states PV1 to PV3. For example, the cell current of the memory cells corresponding to the erase state E may be the largest, and the cell current of the memory cells corresponding to the program state PV3 may be the smallest. In addition, the cell current of the memory cells corresponding to the program state PV1 may be smaller than the cell current of the memory cells corresponding to the erase state E and may be larger than the cell current of the memory cells corresponding to the program state PV2. The cell current of the memory cells corresponding to the program state PV2 may be smaller than the cell current of the memory cells corresponding to the program state PV1 and may be larger than the cell current of the memory cells corresponding to the program state PV3.

As described above, when the same read voltage Vread is applied to the word line, the cell current of the plurality of memory cells F1 to Fn that is programmed to the erase state E and the plurality of program states PV1 to PV3 may be different based on the programmed erase state E and plurality of program states PV1 to PV3. Accordingly, when the bit lines that are connected to the selected memory cells and the sensing node in the page buffer are electrically connected during the read operation, the time at which the potential of the sensing node precharged to the first level is decreased to the second level is changed based on the cell current of the selected memory cells. For example, as the cell current is increased, the time at which the potential of the sensing node is decreased from the first level to the second level may be decreased, and as the cell current is decreased, the time at which the potential of the sensing node is decreased from the first level to the second level may be increased.

Figure 9:
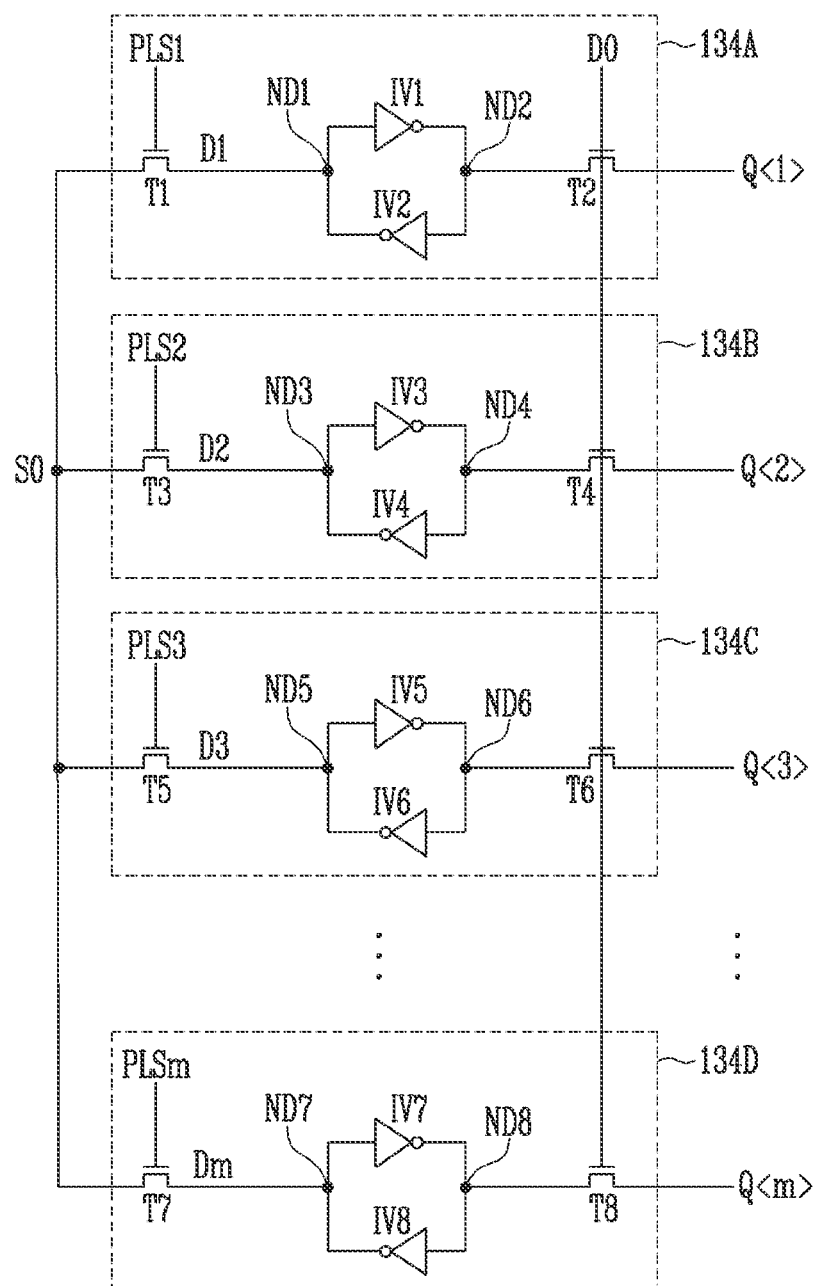
FIG. 9 is a diagram illustrating a first embodiment of a latch component of FIG. 6.

FIG. 9 is a diagram illustrating a first embodiment of the latch component of FIG. 6.

Referring to FIG. 9, the latch component 134 may include a plurality of latch stages 134A to 134D. The number of latch stages 134A to 134D that are included in the latch component 134 may be adjusted based on the number of data bits that may be stored in the memory cells that are included in the memory cell array 110 of FIG. 2. For example, when the memory cells are the MLC, the latch component 134 may include three latch stages, and when the memory cells are the TLC, the latch component 134 may include seven latch stages. In addition, when the memory cells are the QLC, the latch component 134 may include fifteen latch stages.

The latch stage 134A may include a first transistor T1, a first inverter IV1, a second inverter IV2, and a second transistor T2.

The first transistor T1 may be connected between the sensing node SO and a first node ND1 and may be turned on or turned off in response to a first latch signal PLS1. The first inverter IV1 and the second inverter IV2 may be connected in reverse parallel between the first node ND1 and a second node ND2. That is, the first inverter IV1 and the second inverter IV2 may be configured as a latch between the first node ND1 and the second node ND2. The second transistor T2 may be connected between the second node ND2 and the output terminal Q<1> and may be turned on or turned off in response to a data output signal DO.

The first transistor T1 may transmit first data D1 corresponding to the potential of the sensing node SO to the first node ND1 in response to the first latch signal PLS1. The first inverter IV1 and the first inverter IV2 may receive and latch the first data D1, invert the first data D1, and transmit the inverted first data to the second transistor T2. The second transistor T2 may output the inverted first data to the output terminal Q<1> in response to the data output signal DO.

For example, when the sensing node SO is at the first level which is a precharge level, the first transistor T1 may transmit the first data D1 with the potential of the first level to the first node ND1 in response to the first latch signal PLS1. The first inverter IV1 and the first inverter IV2 may receive the first data D1 with the potential of the first level and may control the first node ND1 to a logic high level and the second node ND2 to a logic low level. The second transistor T2 may output the inverted first data of the logic low level to the output terminal Q<1> in response to the data output signal DO.

For example, when the sensing node SO is discharged to the second level, the first transistor T1 may transmit the first data D1 with the potential of the second level to the first node ND1 in response to the first latch signal PLS1. The first inverter IV1 and the second inverter IV2 may receive the first data D1 with the potential of the second level and may control the first node ND1 to a logic low level and the second node ND2 to a logic high level. The second transistor T2 may output the inverted first data of the logic high level to the output terminal Q<1> in response to the data output signal DO.

The latch stage 134B may include a third transistor T3, a third inverter IV3, a fourth inverter IV4, and a fourth transistor T4.

The third transistor T3 may be connected between the sensing node SO and a third node ND3 and may be turned on or turned off in response to a second latch signal PLS2. The third inverter IV3 and the fourth inverter IV4 may be connected in reverse parallel between the third node ND3 and a fourth node ND4. That is, the third inverter IV3 and the fourth inverter IV4 may be configured as a latch between the third node ND3 and the fourth node ND4. The fourth transistor T4 may be connected between the fourth node ND4 and the output terminal Q<2> and may be turned on or turned off in response to the data output signal DO.

Since an operation of the latch stage 134B is similar to that of the latch stage 134A, a detailed description thereof is omitted.

The latch stage 134C may include a fifth transistor T5, a fifth inverter IV5, a sixth inverter IV6, and a sixth transistor T6.

The fifth transistor T5 may be connected between the sensing node SO and a fifth node ND5 and may be turned on or turned off in response to a third latch signal PLS3. The fifth inverter IV5 and the sixth inverter IV6 may be connected in reverse parallel between the fifth node ND5 and a sixth node ND6. That is, the fifth inverter IV5 and the sixth inverter IV6 may be configured as a latch between the fifth node ND5 and the sixth node ND6. The sixth transistor T6 may be connected between the sixth node ND6 and the output terminal Q<3> and may be turned on or turned off in response to the data output signal DO.

Since an operation of the latch stage 134C is similar to that of the latch stage 134A, a detailed description thereof is omitted.

The latch stage 134D may include a seventh transistor T7, a seventh inverter IV7, an eighth inverter IV8, and an eighth transistor T8.

The seventh transistor T7 may be connected between the sensing node SO and a seventh node ND7 and may be turned on or turned off in response to an m-th latch signal PLSm. The seventh inverter IV7 and the eighth inverter IV8 may be connected in reverse parallel between the seventh node ND7 and an eighth node ND8. That is, the seventh inverter IV7 and the eighth inverter IV8 may be configured as a latch between the seventh node ND7 and the eighth node ND8. The eighth transistor T8 may be connected between the eighth node ND8 and the output terminal Q<m> and may be turned on or turned off in response to the data output signal DO.

Since an operation of the latch stage 134D is similar to that of the latch stage 134A, a detailed description thereof is omitted.

Figure 10:
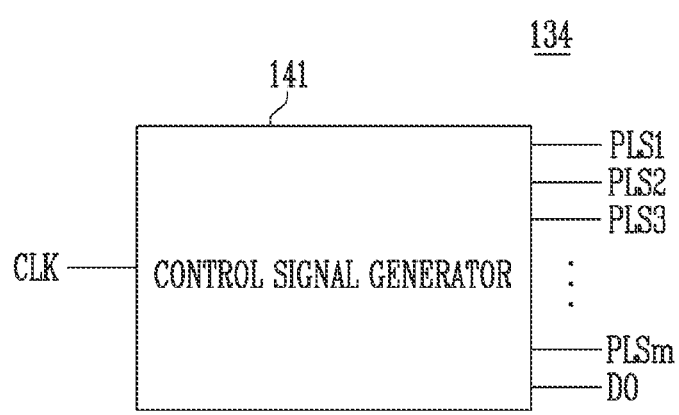
FIG. 10 is a diagram illustrating a control signal generator according to a first embodiment.

FIG. 10 is a diagram illustrating a control signal generator according to a first embodiment.

The control signal generator 141 may generate and may output the first to m-th latch signals PLS1 to PLSm in response to a clock signal CLK that is toggled at a predetermined period. Each of the first to m-th latch signals PLS1 to PLSm may have an activation period that is activated during a predetermined time. The first to m-th latch signals PLS1 to PLSm may be sequentially activated.

In response to the clock signal CLK, the control signal generator 141 may generate and output the data output signal DO that is activated during a predetermined time after the last activated latch signal, that is, the m-th latch signal PLSm, among the first to m-th latch signals PLS1 to PLSm, is activated.

The control signal generator 141 may be included in the control logic 140 of FIG. 2 and configured.

Figure 11:
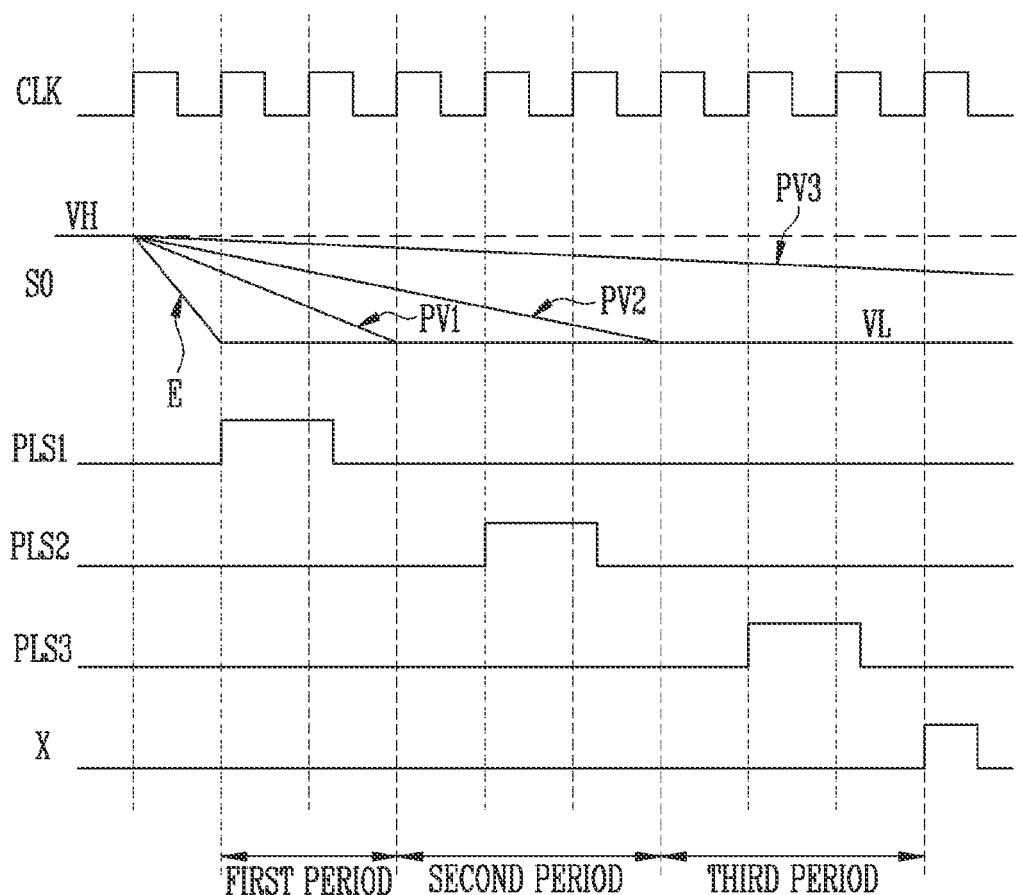
FIG. 11 is a waveform diagram of signals illustrating an operation of a latch component shown in FIG. 9.

FIG. 11 is a waveform diagram of signals illustrating an operation of the latch component shown in FIG. 9.

FIG. 12 is a diagram illustrating a data value output from the latch component shown in FIG. 9.

A read operation of a semiconductor memory device according to an embodiment of the present disclosure is described with reference to FIGS. 2 to 12 as follows.

In an embodiment of the present disclosure, an example in which the memory cells that are connected to one selected word line are the MLC programmed to the erase state E and the plurality of program states PV1 to PV3 and the latch component 134 of FIG. 9 may include three latch stages (for example, 134A, 134B, and 134C) is described.

During the read operation, the voltage generation circuit 150 may generate one read voltage Vread and the pass voltage Vpass based on the voltage generation circuit control signals VG_signals that are output from the control logic 140 and may output the one read voltage Vread and the pass voltage Vpass to the address decoder 120. The address decoder 120 may apply the read voltage Vread that is generated by the voltage generation circuit 150 to the selected word line (for example, WL1) of the selected memory block (for example, BLK1). The address decoder 120 may apply the pass voltage Vpass that is generated by the voltage generation circuit 150 to the unselected word lines (for example, WL2 to WLn) of the selected memory block (for example, BLK1).

The read voltage Vread that is generated by the voltage generation circuit 150 may be lower than the threshold voltage of the program state PV3 with the highest threshold voltage distribution among the erase state E and the plurality of program states PV1 to PV3 as shown in FIG. 7, and may be higher than the threshold voltage of the program state PV2 that is adjacent to the program state PV3 with the highest threshold voltage distribution. For example, the read voltage Vread may be an intermediate voltage value of the two program states PV2 and PV3 with the relatively highest threshold voltage distribution among the erase state E and the plurality of program states PV1 to PV3. In more detail, the read voltage Vread may be an intermediate voltage value of a threshold voltage value of the most memory cells among the memory cells corresponding to the program state PV2 and a threshold voltage value of the most memory cells among the memory cells corresponding to the program state PV3.

As another embodiment, the read voltage Vread may be a voltage that is higher than the threshold voltage of the program state PV3 with the highest threshold voltage distribution among the erase state E and the plurality of program states PV1 to PV3.

The plurality of page buffers PB1 to PBm of the read and write circuit 130 may sense the program state of the memory cells F1 that are connected to the selected word line WL1 through the bit lines BL1 to BLm.

Since the plurality of page buffers PB1 to PBm perform the sensing operation in methods similar to each other, the operation in which the page buffer PB1 senses the program state of the memory cell that is connected to the corresponding bit line BL1 is described as an example as follows.

The precharger 133 may precharge the bit line BL1 to a precharge level through the sensor 132 and the bit line selector 131. In addition, the precharger 133 may precharge the sensing node SO to a first level VH.

When the read voltage Vread is applied to the selected word line WL1, a cell current that flows through the bit line BL1 may be generated based on the program state of the memory cell F1 that is connected to the bit line BL1. For example, when the memory cell F1 is in the erase state E, the cell current may be the largest, and when the memory cell F1 is in the program state PV3, the cell current may be the smallest.

The bit line selector 131 and the sensor 132 may electrically connect the bit line BL1 and the sensing node SO and may evaluate the sensing node SO based on the cell current of the memory cell F1. That is, the cell current corresponding to the program state of the memory cell F1 may flow through the bit line BL1. The sensing node SO that is connected to the bit line BL1 may be decreased from the first level VH to a second level VL based on the cell current, and a time at which the sensing node SO is decreased from the first level VH to the second level VL may be adjusted based on a magnitude of the cell current. As a result, the time at which the potential of the sensing node SO is decreased from the first level VH to the second level VL may be adjusted based on the program state of the memory cell.

For example, when the selected memory cell F1 is in the erase state E with the lowest threshold voltage distribution, the cell current of the bit line BL1 may be the largest, and the time at which the potential of the sensing node SO is decreased from the first level VH to the second level VL may be the shortest. For example, when the selected memory cell F1 is in the erase state E, the potential of the sensing node SO may be discharged to the second level VL within a first period.

For example, when the selected memory cell F1 is in the program state PV1 with the threshold voltage distribution higher than that of the erase state E, the cell current of the bit line BL1 may be smaller than the cell current corresponding to the erase state E, and the time at which the potential of the sensing node SO is decreased from the first level VH to the second level VL may be longer than the time corresponding to the erase state E. For example, when the selected memory cell F1 is in the program state P1, the potential of the sensing node SO may be discharged to the second level VL within a second period.

For example, when the selected memory cell F1 is in the program state PV2 with the threshold voltage distribution higher than that of the program state PV1, the cell current of the bit line BL1 may be smaller than the cell current corresponding to the program state PV1, and the time at which the potential of the sensing node SO is decreased from the first level VH to the second level VL may be longer than the time corresponding to the program state PV1. For example, when the selected memory cell F1 is in the program state P2, the potential of the sensing node SO may be discharged to the second level VL within a third period.

For example, when the selected memory cell F1 is in the program state PV3 with the highest threshold voltage distribution, the cell current of the bit line BL1 may be the smallest.

The control signal generator 141 may generate and may output the first to third latch signals PLS1 to PLS3 in response to the clock signal CLK that is toggled at a predetermined period. Each of the first to third latch signals PLS1 to PLS3 may have an activation period that is activated during a predetermined time. The first to third latch signals PLS1 to PLS3 may be sequentially activated.

For example, the first latch signal PLS1 may be activated during a predetermined time from a time point at which the potential level of the sensing node SO is decreased from the first level VH to the second level VL by the memory cell of the erase state E to a time point before the potential level of the sensing node SO is decreased from the first level VH to the second level VL by the memory cell of the program state PV1. For example, the first latch signal PLS1 may be activated during a predetermined time within the first period.

For example, the second latch signal PLS2 may be activated during a predetermined time from a time point at which the potential level of the sensing node SO is decreased from the first level VH to the second level VL by the memory cell of the program state PV1 to a time point before the potential level of the sensing node SO is decreased from the first level VH to the second level VL by the memory cell of the program state PV2. For example, the second latch signal PLS2 may be activated during a predetermined time within the second period.

For example, the third latch signal PLS3 may be activated during a predetermined time after a time point at which the potential level of the sensing node SO is decreased from the first level VH to the second level VL by the memory cell of the program state PV2. For example, the third latch signal PLS3 may be activated during a predetermined time within the third period.

The plurality of respective latch stages 134A to 134C of the latch component 134 may sequentially latch data in response to the corresponding first to third latch signals PLS1 to PLS3.

For example, in response to the first latch signal PLS1, the latch stage 134A may latch first data D1 corresponding to the potential of the sensing node SO from the time point at which the potential level of the sensing node SO is decreased from the first level VH to the second level VL by the memory cell of the erase state E to the time point before the potential level of the sensing node SO is decreased from the first level VH to the second level VL by the memory cell of the program state PV1. That is, the latch stage 134A may latch the first data D1 corresponding to the potential of the sensing node SO within the first period.

For example, in response to the second latch signal PLS2, the latch stage 134B may latch second data D2 corresponding to the potential of the sensing node SO from the time point at which the potential level of the sensing node SO is decreased from the first level VH to the second level VL by the memory cell of the program state PV1 to the time point before the potential level of the sensing node SO is decreased from the first level VH to the second level VL by the memory cell of the program state PV2. That is, the latch stage 134B may latch the second data D2 corresponding to the potential of the sensing node SO within the second period.

For example, in response to the third latch signal PLS3, the latch stage 134C may latch third data D3 corresponding to the potential of the sensing node SO after the time point at which the potential level of the sensing node SO is decreased from the first level VH to the second level VL by the memory cell of the program state PV2. That is, the latch stage 134C may latch the third data D3 corresponding to the potential of the sensing node SO within the third period.

Each of the plurality of latch stages 134A to 134C of the latch component 134 may output the latched data to output terminals Q<3;1> in response to the data output signal DO.

For example, when the selected memory cell F1 that is connected to the bit line BL1 is in the erase state E, the sensing node SO may be decreased to the second level VL in the first to third periods. Accordingly, the plurality of latch stages 134A, 134B, and 134C may latch the first to third data D1 to D3 of a logic low level and may output the first to third data that are inverted to a logic high level to the output terminals Q<3;1>. That is, each of the output terminals Q<3;1> may output "1" data corresponding to the logic high level.

For example, when the selected memory cell F1 that is connected to the bit line BL1 is in the program state PV1, the sensing node SO might not reach the second level VL in the first period and the sensing node SO may be decreased to the second level VL in the second and third periods. Accordingly, the latch stage 134A may latch the first data D1 of a logic high level, and the latch stages 134B and 134C latch the second and third data D2 and D3 of a logic low level. Accordingly, the output terminal Q<1> may output "0" data corresponding to the logic low level, and the output terminals Q<2> and Q<3> output "1" data corresponding to the logic high level.

For example, when the selected memory cell F1 that is connected to the bit line BL1 is in the program state PV2, the sensing node SO might not reach the second level VL in the first and second periods, and the sensing node SO may be decreased to the second level VL in the third period. Accordingly, the respective latch stages 134A and 134B latch the first data D1 and the second data D2 of a logic high level, and the latch stage 134C may latch the third data D3 of a logic low level. Accordingly, each of the output terminals Q<1> and Q<2> may output "0" data corresponding to the logic low level, and the output terminal Q<3> may output "1" data corresponding to the logic high level.

For example, when the selected memory cell F1 that is connected to the bit line BL1 is in the program state PV3, the sensing node SO might not be decreased to the second level VL in the first to third periods. Accordingly, the plurality of latch stages 134A, 134B, and 134C may latch the first to third data D1 to D3 of a logic high level and may output the first to third data that are inverted to a logic low level to the output terminals Q<3;1>. That is, each of the output terminals Q<3;1> may output "0" data corresponding to the logic low level.

The data output circuit 135 may receive data from the output terminals Q<3;1> and may output MSB data and LSB data as bit read data DATA to the bit out line BITOUT based on the received data.

As described above, according to an embodiment of the present disclosure, during a read operation of memory cells in which a plurality of data bits are stored, in a state in which one read voltage is applied to the word line, the program state of the memory cells may be sensed by sensing the time point at which the sensing node SO is decreased to the second level. Accordingly, an operation speed of the read operation may be improved, and the area of a circuit generating the read voltage may be reduced by using only one read voltage instead of a plurality of read voltages.

In the above-described embodiment, the read voltage Vread that is applied to the selected word line may be lower than the threshold voltage of the program state PV3 with the relatively highest threshold voltage distribution among the erase state E and the plurality of program states PV1 to PV3 as shown in FIG. 7 and may be higher than the threshold voltage of the program state PV2 that is adjacent to the program state PV3 with the highest threshold voltage distribution.

In another embodiment, the read voltage Vread may be a voltage that is higher than the threshold voltage of the program state PV3 with the highest threshold voltage distribution among the erase state E and the plurality of program states PV1 to PV3. During the read operation, according to another embodiment, when the read voltage Vread that is higher than the threshold voltage of the program state PV3 is applied to the selected word line, the bit lines corresponding to the memory cells that are programmed to the erase state E and the plurality of program states PV1 to PV3 may have different cell current amounts. Accordingly, the time at which the potential level of the sensing node SO is decreased from the first level to the second level may be changed based on the program state of the memory cell. The latch component 134 may latch the data corresponding to the potential level of the sensing node SO at a plurality of set time points to sense the program state of the memory cell.

FIG. 13 is a diagram illustrating a second embodiment of the latch component of FIG. 6.

Referring to FIG. 13, the latch component 134 may include a plurality of latch stages 134E to 134H. The number of latch stages 134E to 134H that are included in the latch component 134 may be adjusted based on the number of data bits that may be stored in the memory cells included in the memory cell array 110 of FIG. 2. For example, when the memory cells are the MLC, the latch component 134 may include three latch stages, and when the memory cells are the TLC, the latch component 134 may include seven latch stages. In addition, when the memory cells are the QLC, the latch component 134 may include fifteen latch stages.

Each of the plurality of latch stages 134E to 134H may be configured of a D flip-flop.

The latch stage 134E may latch the data corresponding to the potential level of the sensing node SO in response to a rising edge of a toggling latch signal PLS and may output the latched data to the output terminal Q<1> in response to a falling edge of the latch signal PLS.

The latch stage 134F may latch the data that is received from the output terminal Q<1> in response to the rising edge of the toggling latch signal PLS and may output the latched data to the output terminal Q<2> in response to the falling edge of the latch signal PLS.

The latch stage 134G may latch the data that is received from the output terminal Q<2> in response to the rising edge of the toggling latch signal PLS and may output the latched data to the output terminal Q<3> in response to the falling edge of the latch signal PLS.

The latch stage 134H may latch the data that is received from the output terminal Q<m−1> in response to the rising edge of the toggling latch signal PLS and may output the latched data to the output terminal Q<m> in response to the falling edge of the latch signal PLS.

For example, the latch stage 134E may latch the data corresponding to the potential of the sensing node SO in response to a first rising edge of the latch signal PLS and may output the latched data to the output terminal Q<1> in response to a first falling edge of the latch signal PLS.

The latch stage 134E may latch new data corresponding to the potential of the sensing node SO in response to a second rising edge of the latch signal PLS, and the latch stage 134F may latch the data that is received from the output terminal Q<1> in response to a second rising edge of the latch signal PLS. That is, the latch stage 134F may latch the data that is output from the latch stage 134E in response to the second rising edge. The latch stage 134E may output the latched data to the output terminal Q<1> in response to a second falling edge of the latch signal PLS, and the latch stage 134F may output the latched data to the output terminal Q<2> in response to the second falling edge of the latch signal PLS.

The latch stage 134E may latch new data corresponding to the potential of the sensing node SO in response to a third rising edge of the latch signal PLS, the latch stage 134F may latch the data that is received from the output terminal Q<1> in response to the third rising edge of the latch signal PLS, and the latch stage 134G may latch the data that is received from the output terminal Q<2> in response to the third rising edge of the latch signal PLS. The latch stage 134E may output the latched data to the output terminal Q<1> in response to a third falling edge of the latch signal PLS, the latch stage 134F may output the latched data to the output terminal Q<2> in response to the third falling edge of the latch signal PLS, and the latch stage 134G may output the latched data to the output terminal Q<3> in response to the third falling edge of the latch signal PLS.

As described above, the plurality of latch stages 134E to 134H of the latch component 134 may latch the data corresponding to the potential of the sensing node SO whenever the latch signal PLS is toggled and may transmit data latched during a previous toggle of the latch signal PLS to a next latch stage.

FIG. 14 is a diagram illustrating a second embodiment of the control signal generator.

Referring to FIG. 14, the control signal generator 142 may generate and output the latch signal PLS that is toggled a plurality of times in response to the clock signal CLK that is toggled. The control signal generator 142 may be included in the control logic 140 of FIG. 2 and configured.

The timing of the rising edges when the latch signal PLS transits from a low level to a high level and the timing of the falling edges when the latch signal PLS transits from the high level to the low level may be set based on the cell current amounts corresponding to each of the erase state and the plurality of program states.

FIG. 15 is a waveform diagram of signals illustrating an operation of the latch component shown in FIG. 13.

FIG. 16 is a diagram illustrating a data value output from the latch component shown in FIG. 13.

A read operation of a semiconductor memory device according to an embodiment of the present disclosure is described with reference to FIGS. 8 and 13 to 16 as follows.

In an embodiment of the present disclosure, an example in which the memory cells that are connected to one selected word line may be the MLC that is programmed to the erase state E and the plurality of program states PV1 to PV3 and the latch component 134 of FIG. 13 may include three latch stages (for example, 134E, 134F, and 134G) is described.

During the read operation, the voltage generation circuit 150 may generate one read voltage Vread and the pass voltage Vpass based on the voltage generation circuit control signals VG_signals that are output from the control logic 140 and may output the one read voltage Vread and the pass voltage Vpass to the address decoder 120. The address decoder 120 may apply the read voltage Vread that is generated by the voltage generation circuit 150 to the selected word line (for example, WL1) of the selected memory block (for example, BLK1). The address decoder 120 may apply the pass voltage Vpass that is generated by the voltage generation circuit 150 to the unselected word lines (for example, WL2 to WLn) of the selected memory block (for example, BLK1).

The read voltage Vread that is generated by the voltage generation circuit 150 may be lower than the threshold voltage of the program state PV3 with the highest threshold voltage distribution among the erase state E and the plurality of program states PV1 to PV3, as shown in FIG. 7, and may be higher than the threshold voltage of the program state PV2 that is adjacent to the program state PV3 with the highest threshold voltage distribution. For example, the read voltage Vread may be an intermediate voltage value of the two program states PV2 and PV3 with the relatively highest threshold voltage distribution among the erase state E and the plurality of program states PV1 to PV3. In more detail, the read voltage Vread may be an intermediate voltage value of a threshold voltage value of the most memory cells among the memory cells corresponding to the program state PV2 and a threshold voltage value of the most memory cells among the memory cells corresponding to the program state PV3.

As another embodiment, the read voltage Vread may be a voltage that is higher than the threshold voltage of the program state PV3 with the highest threshold voltage distribution among the erase state E and the plurality of program states PV1 to PV3.

The plurality of page buffers PB1 to PBm of the read and write circuit 130 may sense the program state of the memory cells F1 that are connected to the selected word line WL1 through the bit lines BL1 to BLm.

Since the plurality of page buffers PB1 to PBm perform the sensing operation in methods that are similar to each other, the operation in which the page buffer PB1 senses the program state of the memory cell that is connected to the corresponding bit line BL1 is described as an example as follows.

The precharger 133 may precharge the bit line BL1 to a precharge level through the sensor 132 and the bit line selector 131. In addition, the precharger 133 may precharge the sensing node SO to a first level VH.

When the read voltage Vread is applied to the selected word line WL1, a cell current that flows through the bit line BL1 may be generated based on the program state of the memory cell F1 that is connected to the bit line BL1. For example, when the memory cell F1 is in the erase state E, the cell current may be the largest, and when the memory cell F1 is in the program state PV3, the cell current may be the smallest.

The bit line selector 131 and the sensor 132 may electrically connect the bit line BL1 to the sensing node SO and may evaluate the sensing node SO based on the cell current of the memory cell F1. That is, the cell current corresponding to the program state of the memory cell F1 may flow through the bit line BL1. The sensing node SO that is connected to the bit line BL1 may be decreased from the first level VH to a second level VL based on the cell current, and a time at which the sensing node SO is decreased from the first level VH to the second level VL may be adjusted based on a magnitude of the cell current. As a result, the time at which the potential of the sensing node SO is decreased from the first level VH to the second level VL may be adjusted based on the program state of the memory cell.

For example, when the selected memory cell F1 is in the erase state E with the lowest threshold voltage distribution, the cell current of the bit line BL1 may be the largest, and the time at which the potential of the sensing node SO is decreased from the first level VH to the second level VL may be the shortest. For example, when the selected memory cell F1 is in the erase state E, the potential of the sensing node SO may be discharged to the second level VL within a first period.

For example, when the selected memory cell F1 is in the program state PV1 with the threshold voltage distribution that is higher than that of the erase state E, the cell current of the bit line BL1 may be smaller than the cell current corresponding to the erase state E, and the time at which the potential of the sensing node SO is decreased from the first level VH to the second level VL may be longer than the time corresponding to the erase state E. For example, when the selected memory cell F1 is in the program state P1, the potential of the sensing node SO may be discharged to the second level VL within a second period.

For example, when the selected memory cell F1 is in the program state PV2 with the threshold voltage distribution higher than that of the program state PV1, the cell current of the bit line BL1 may be smaller than the cell current corresponding to the program state PV1, and the time at which the potential of the sensing node SO is decreased from the first level VH to the second level VL may be longer than the time corresponding to the program state PV1. For example, when the selected memory cell F1 is in the program state P2, the potential of the sensing node SO may be discharged to the second level VL within a third period.

For example, when the selected memory cell F1 is in the program state PV3 with the highest threshold voltage distribution, the cell current of the bit line BL1 may be the smallest.

The control signal generator 142 may generate and may output the latch signal PLS that toggles a plurality of times in response to the clock signal CLK that is toggled at a predetermined period.

For example, a first toggle period of the latch signal PLS may be included in the first period, which is a period from the time point at which the potential level of the sensing node SO is decreased from the first level VH to the second level VL by the memory cell of the erase state E to the time point before the potential level of the sensing node SO is decreased from the first level VH to the second level VL by the memory cell of the program state PV1. That is, the first rising edge and falling edge of the latch signal PLS may be included in the first period.

For example, a second toggle period of the latch signal PLS may be included in the second period, which is a period from the time point at which the potential level of the sensing node SO is decreased from the first level VH to the second level VL by the memory cell of the program state PV1 to the time point before the potential level of the sensing node SO is decreased from the first level VH to the second level VL by the memory cell of the program state PV2. That is, the second rising edge and falling edge of the latch signal PLS may be included in the second period.

For example, a third toggle period of the latch signal PLS may be included in the third period, which is a period after the time point at which the potential level of the sensing node SO is decreased from the first level VH to the second level VL by the memory cell of the program state PV2. That is, the third rising edge and falling edge of the latch signal PLS may be included in the third period.

The timing of the rising edges and the falling edges of the latch signal PLS may be set based on the cell currents corresponding to each of the erase state E and the plurality of program states PV1 to PV3. In more detail, the timing of the rising edges and the timing of the falling edges of the latch signal PLS may be set based on the time point at which the sensing node of FIG. 6 is decreased from the first level VH which is the precharge level to the second level VL based on the cell currents corresponding to each of the erase state and the plurality of program states.

Each of the plurality of latch stages 134E to 134G of the latch component 134 may latch data in response to the latch signal PLS.

For example, in the first period in which the latch signal PLS firstly toggles, the latch stage 134E may latch the data corresponding to the potential of the sensing node SO in response to the rising edge of the latch signal PLS. For example, when the memory cell F1 is in the erase state E, the latch stage 134E may latch "0" data corresponding to the potential of the sensing node SO that is decreased to the second level LV. The latch stage 134E may output the latched "0" data to the output terminal Q<1> in response to the falling edge of the latch signal PLS. For example, when the memory cell F1 is in any one of the program states PV1, PV2, and PV3, the latch stage 134E may latch "1" data corresponds to the potential of the sensing node SO higher than the second level LV. The latch stage 134E may output the latched "1" data to the output terminal Q<1> in response to the falling edge of the latch signal PLS.

In the second period in which the latch signal PLS secondly toggles, the latch stage 134F may receive and latch the data that is output from the latch stage 134E in response to the rising edge of the latch signal PLS, the latch stage 134E may latch the data corresponding to the potential of the sensing node SO. For example, when the memory cell F1 is in the erase state E or the program state PV1, the latch stage 134E may latch the "0" data corresponding to the potential of the sensing node SO that is decreased to the second level LV. For example, when the memory cell F1 is in any one of the program states PV2 and PV3, the latch stage 134E may latch the "1" data corresponding to the potential of the sensing node SO higher than the second level LV.

The latch stage 134E may output the latched data to the output terminal Q<1> in response to the falling edge of the latch signal PLS. The latch stage 134F may output the latched data to the output terminal Q<2> in response to the falling edge of the latch signal PLS.

In the third period in which the latch signal PLS thirdly toggles, the latch stage 134G may receive and latch the data that is output from the latch stage 134F in response to the rising edge of the latch signal PLS, and the latch stage 134F may receive and latch the data that is output from the latch stage 134E in response to the rising edge of the latch signal PLS, and the latch stage 134E may latch the data corresponding to the potential of the sensing node SO. For example, when the memory cell F1 is in the erase state E, the program state PV1, or the program state PV2, the latch stage 134E may latch the "0" data corresponding to the potential of the sensing SO decreased to the second level LV. For example, when the memory cell F1 is in the program state PV3, the latch stage 134E may latch the data "1" corresponding to the potential of the sensing node SO that is higher than the second level LV.

The latch stage 134E may output the latched data to the output terminal Q<1> in response to the falling edge of the latch signal PLS. The latch stage 134F may output the latched data to the output terminal Q<2> in response to the falling edge of the latch signal PLS. The latch stage 134G may output the latched data to the output terminal Q<3> in response to the falling edge of the latch signal PLS.

The data output circuit 135 may receive data from the output terminals Q<3;1> and may output MSB data and LSB data as bit read data DATA to the bit out line BITOUT based on the received data.

As described above, according to an embodiment of the present disclosure, during a read operation of memory cells in which a plurality of data bits are stored, in a state in which one read voltage is applied to the word line, the program state of the memory cells may be sensed by sensing the time point at which the sensing node SO is decreased to the second level. Accordingly, an operation speed of the read operation may be improved, and the area of a circuit that generates the read voltage may be reduced by using only one read voltage instead of a plurality of read voltages.

Figure 17:
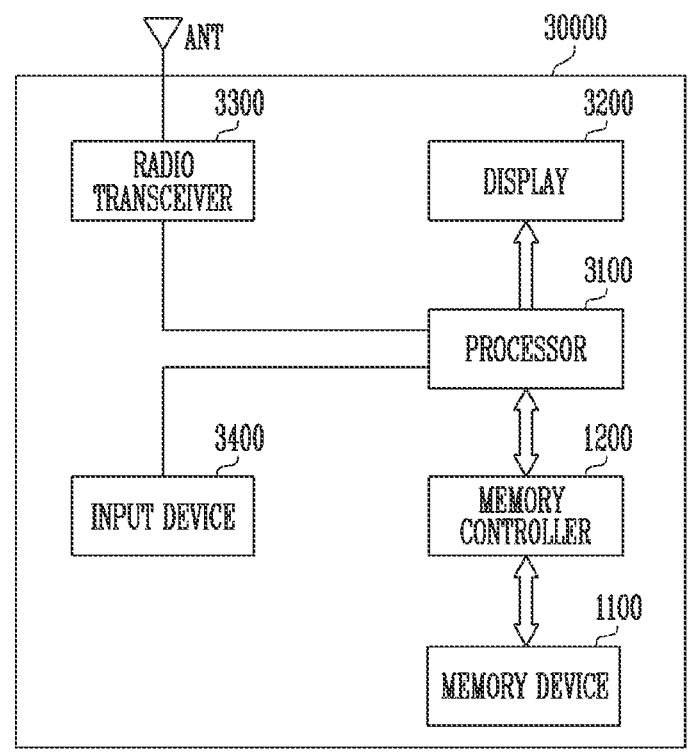
FIG. 17 is a diagram illustrating another embodiment of the memory system.

FIG. 17 is a diagram illustrating another embodiment of the memory system.

Referring to FIG. 17, the memory system 30000 may be implemented as a cellular phone, a smart phone, a tablet PC, a personal digital assistant (PDA) or a wireless communication device. The memory system 30000 may include the memory device 1100 and the memory controller 1200 capable of controlling the operation of the memory device 1100. The memory controller 1200 may control a data access operation, for example, a program operation, an erase operation, or a read operation, of the memory device 1100 under control of a processor 3100.

Data programmed in the memory device 1100 may be output through a display 3200 under the control of the memory controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 1200 or the display 3200. The memory controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data that is output from the memory controller 1200, data that is output from the radio transceiver 3300, or data that is output from the input device 3400 is output through the display 3200.

According to an embodiment, the memory controller 1200 capable of controlling the operation of memory device 1100 may be implemented as a part of the processor 3100 and may also be implemented as a chip separate from the processor 3100. In addition, the memory controller 1200 may be implemented through the example of the controller 1200 shown in FIG. 1.

Figure 18:
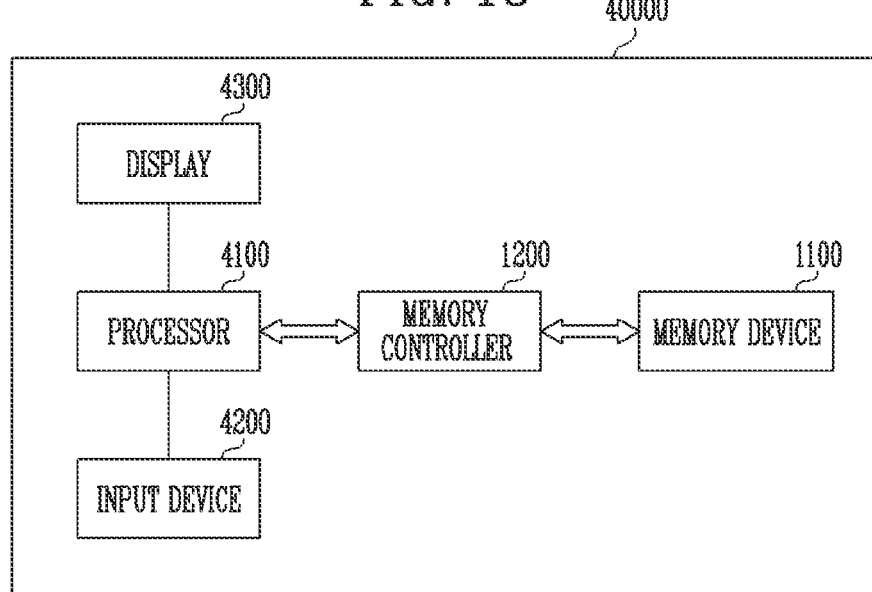
FIG. 18 is a diagram illustrating another embodiment of the memory system.

FIG. 18 is a diagram illustrating another embodiment of the memory system.

Referring to FIG. 18, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the memory device 1100.

A processor 4100 may output data that is stored in the memory device 1100 through a display 4300 based on data that is input through an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. According to an embodiment, the memory controller 1200 capable of controlling the operation of memory device 1100 may be implemented as a part of the processor 4100 or may be implemented as a chip separate from the processor 4100. In addition, the memory controller 1200 may be implemented through the example of the controller 1200 shown in FIG. 1.

Figure 19:
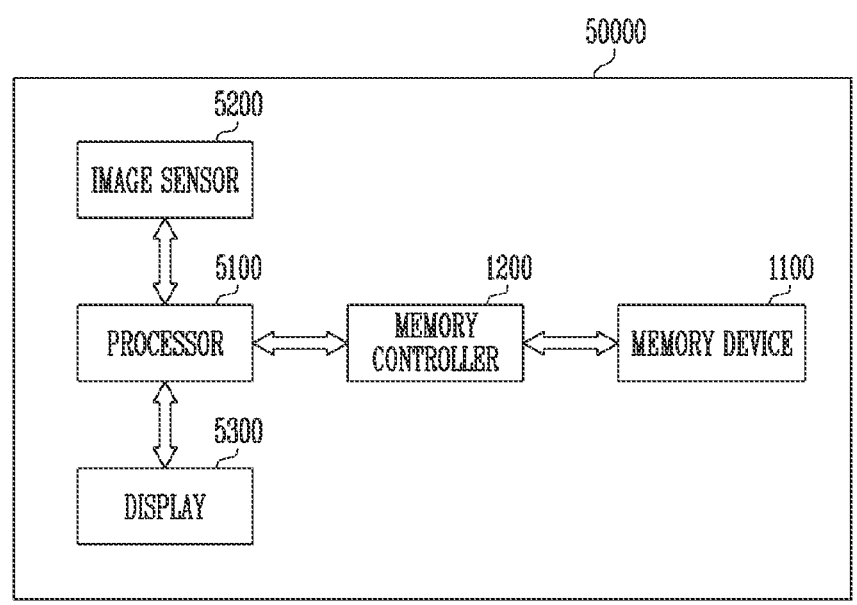
FIG. 19 is a diagram illustrating another embodiment of the memory system.

FIG. 19 is a diagram illustrating another embodiment of the memory system.

Referring to FIG. 19, the memory system 50000 may be implemented as an image processing device, for example, a digital camera, a portable phone provided with a digital camera, a smart phone provided with a digital camera, or a tablet PC provided with a digital camera.

The memory system 50000 may include the memory device 1100 and the memory controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the memory controller 1200. In addition, data stored in the memory device 1100 may be output through the display 5300 under the control of the processor 5100 or the memory controller 1200.

According to an embodiment, the memory controller 1200 capable of controlling the operation of memory device 1100 may be implemented as a part of the processor 5100 or may be implemented as a chip separate from the processor 5100. In addition, the memory controller 1200 may be implemented through the example of the controller 1200 shown in FIG. 1.

Figure 20:
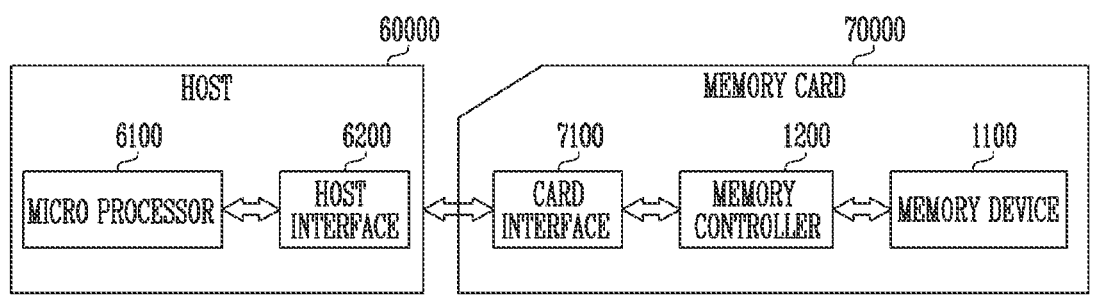
FIG. 20 is a diagram illustrating another embodiment of the memory system.

FIG. 20 is a diagram illustrating another embodiment of the memory system.

Referring to FIG. 20, the memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multimedia card (MMC) interface, but is not limited thereto. In addition, the memory controller 1200 may be implemented through the example of the controller 1200 shown in FIG. 1.

The card interface 7100 may interface data exchange between a host 60000 and the memory controller 1200 based on a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the memory controller 1200 under control of a microprocessor 6100.

Although the present disclosure has been described with reference to the limited embodiments and drawings, the present disclosure is not limited to the embodiments described above, and various changes and modifications may be made from the disclosed description by those skilled in the art to which the present disclosure pertains.

What is claimed is:
1. A page buffer comprising:
a bit line selector configured to connect a bit line of a memory cell array to a sensing node;
a precharger configured to precharge a potential of the sensing node to a first level; and a latch component configured to sense data by detecting a time at which the potential of the sensing node is decreased from the first level to a second level, wherein the latch component comprises:

a first latch stage configured to latch data corresponding to the potential of the sensing node in response to a rising edge of a latch signal and configured to output the latched data to a first output terminal in response to a falling edge of the latch signal;

a second latch stage configured to latch the data that is received from the first output terminal in response to the rising edge of the latch signal and configured to output the latched data to a second output terminal in response to the falling edge of the latch signal; and a third latch stage configured to latch the data that is received from the second output terminal in response to the rising edge of the latch signal and configured to output the latched data to a third output terminal in response to the falling edge of the latch signal.

2. The page buffer of claim 1, further comprising:

a data output circuit configured to receive data that is output from a plurality of output terminals of the latch component and output the data to an external device.

3. The page buffer of claim 1, wherein each of the first latch stage, the second latch stage, and the third latch stage latches the data corresponding to the potential of the sensing node in response to the latch signal that is toggled a plurality of times.

4. A semiconductor memory device comprising:

a memory block with a plurality of memory cells that are programmed to an erase state and a plurality of program states;

a voltage generation circuit configured to generate one read voltage to be applied to word lines of the memory block during a read operation; and a read and write circuit that is connected to bit lines of the memory block and configured to latch data by sensing a potential level of a sensing node based on a cell current of the plurality of memory cells during the read operation, wherein the read and write circuit includes a plurality of page buffers that are connected to the bit lines, respectively, and each of the plurality of page buffers comprises:

a bit line selector configured to connect any one of the bit lines and the sensing node;

a precharger configured to precharge a potential of the sensing node to a first level; and a latch component configured to sense the data by detecting a time at which the potential of the sensing node is decreased from the first level to a second level, wherein the latch component comprises:

a first latch stage configured to latch data corresponding to the potential of the sensing node in response to a rising edge of a latch signal and configured to output the latched data to a first output terminal in response to a falling edge of the latch signal;

a second latch stage configured to latch the data that is received from the first output terminal in response to the rising edge of the latch signal and configured to output the latched data to a second output terminal in response to the falling edge of the latch signal; and a third latch stage configured to latch the data that is received from the second output terminal in response to the rising edge of the latch signal and configured to output the latched data to a third output terminal in response to the falling edge of the latch signal.

5. The semiconductor memory device of claim 4, wherein the cell current of the plurality of memory cells is changed based on the erase state and the plurality of program states in a state in which the one read voltage is applied during the read operation.

6. The semiconductor memory device of claim 4, wherein the one read voltage is lower than a threshold voltage of a program state with a highest threshold voltage distribution among the erase state and the plurality of program states.

7. The semiconductor memory device of claim 4, wherein the one read voltage is an intermediate voltage value of two program states with a relatively highest threshold voltage distribution among the erase state and the plurality of program states.

8. The semiconductor memory device of claim 7, wherein the one read voltage is an intermediate voltage value of a first threshold voltage value of the most memory cells, among memory cells corresponding to a first program state of the two program states, and a second threshold voltage value of the most memory cells, among memory cells corresponding to a second program state of the two program states.

9. The semiconductor memory device of claim 4, wherein each of the plurality of page buffers further comprises a data output circuit configured to receive data that is output from a plurality of output terminals of the latch component and configured to output the data to an external device.

10. The semiconductor memory device of claim 4, wherein each of the first latch stage, the second latch stage, and the third latch stage latches the data corresponding to the potential of the sensing node in response to the latch signal that is toggled a plurality of times.

11. A semiconductor memory device comprising:

a memory block with a plurality of memory cells that are programmed to an erase state and a plurality of program states;

a voltage generation circuit configured to generate one read voltage to be applied to word lines of the memory block during a read operation; and a page buffer connected to a bit line of the memory block, configured to precharge a potential of a sensing node that is connected to the bit line to a first level during the read operation, and configured to latch data by detecting a time at which the sensing node is decreased from the first level to a second level based on a program state of a selected memory cell among the plurality of memory cells that are connected to the bit line, wherein the page buffer comprises:

a bit line selector configured to connect the bit line and the sensing node;

a precharger configured to precharge the potential of the sensing node to the first level; and a latch component configured to sense the data by detecting a time at which the potential of the sensing node is decreased from the first level to the second level, wherein the latch component includes a plurality of latch stages, and wherein each of the plurality of latch stages comprises:

a first transistor connected between the sensing node and a first node and configured to be turned on in response to any one of a plurality of latch signals;

a latch connected between the first node and a second node; and a second transistor connected between the second node and an output terminal and configured to be turned on in response to a data output signal.

* * * * *